US006425117B1

(12) United States Patent
Pasch et al.

(10) Patent No.: US 6,425,117 B1
(45) Date of Patent: *Jul. 23, 2002

(54) SYSTEM AND METHOD FOR PERFORMING OPTICAL PROXIMITY CORRECTION ON THE INTERFACE BETWEEN OPTICAL PROXIMITY CORRECTED CELLS

(75) Inventors: Nicholas F. Pasch, Pacifica; Nicholas K. Eib, San Jose; Colin D. Yates, San Jose; Shumay Dou, San Jose, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/937,296

(22) Filed: Sep. 29, 1997

Related U.S. Application Data

(63) Continuation-in-part of application No. 08/401,099, filed on Mar. 6, 1995.

(51) Int. Cl.[7] .............................................. G06F 17/50
(52) U.S. Cl. .............................. 716/21; 716/19; 716/20; 430/5
(58) Field of Search ................................ 364/488, 489, 364/490, 491; 395/500; 430/5; 716/21, 19, 20, 4, 5

(56) References Cited

U.S. PATENT DOCUMENTS

| 4,463,205 A | 7/1984 | Spinner ........................ 585/455 |
| 4,520,269 A | 5/1985 | Jones ........................ 250/492.2 |
| 4,580,228 A | 4/1986 | Noto ............................ 364/491 |
| 4,584,653 A | 4/1986 | Chih et al. ................... 364/491 |
| 4,613,940 A | 9/1986 | Shenton et al. .............. 364/490 |
| 4,701,778 A | 10/1987 | Aneha et al. ................. 357/45 |
| 4,737,920 A | 4/1988 | Ozawa ........................ 364/490 |
| 4,890,239 A | 12/1989 | Ausschnitt et al. ......... 364/491 |
| 4,949,275 A | 8/1990 | Nonaka ....................... 364/490 |
| 4,972,324 A | 11/1990 | Tanaka ........................ 364/491 |
| 5,019,997 A | 5/1991 | Haller ......................... 364/488 |
| 5,173,864 A | 12/1992 | Watanabe et al. ............ 364/491 |
| 5,182,718 A | 1/1993 | Harafuji et al. .............. 364/490 |
| 5,223,733 A | 6/1993 | Doi et al. .................... 257/386 |
| 5,241,185 A | 8/1993 | Meiri et al. ............... 250/492.2 |
| 5,242,770 A | 9/1993 | Chen et al. ..................... 430/5 |
| 5,251,140 A | 10/1993 | Chung et al. ........... 364/474.02 |
| 5,253,182 A | 10/1993 | Suzuki ........................ 364/489 |
| 5,294,800 A | 3/1994 | Chung et al. ........... 250/492.22 |
| 5,313,068 A | 5/1994 | Meiri et al. ............. 250/492.22 |
| 5,379,023 A | 1/1995 | Tripathi et al. .............. 364/491 |
| 5,387,810 A | 2/1995 | Seta et al. ................... 257/370 |
| 5,388,054 A | 2/1995 | Tokumaru et al. ........... 364/490 |
| 5,468,977 A | 11/1995 | Machida ..................... 257/208 |
| 5,682,323 A | * 10/1997 | Pasch et al. ................. 364/491 |

OTHER PUBLICATIONS

Garofalo et al. "Automatic Proximity Correction for 0.35 um I–Line Photolithography," IEEE, pp. 93–94, Jun. 1994.*
Lee et al "Lithography Technology Development and Design Rule Consideration for 0.4–0.35/SPL MU/M DRAM," IEEE, pp. 300–308, May 1995.*
Harafuji et al "A Novel Hierarchical Approach for Proximity Effect Correction in Electron Beam Lithography," IEEE, pp. 1508–1513, Oct. 1993.*

* cited by examiner

Primary Examiner—Vuthe Siek
(74) Attorney, Agent, or Firm—Beyer Weaver Thomas

(57) ABSTRACT

The system and method performs optical proximity correction on an integrated circuit (IC) mask design by initially performing optical proximity correction on a library of cells that are used to create the IC. The pre-tested cells are imported onto a mask design. All cells are placed a minimum distance apart to ensure that no proximity effects will occur between elements fully integrated in different cells. A one-dimensional optical proximity correction technique is performed on the mask design by performing proximity correction only on those components, e.g., lines, that are not fully integrated within one cell.

18 Claims, 9 Drawing Sheets

SYSTEM AND METHOD FOR PERFORMING OPTICAL PROXIMITY CORRECTION ON THE INTERFACE BETWEEN OPTICAL PROXIMITY CORRECTED CELLS

CROSS REFERENCE TO RELATED APPLICATION

This application is a continuation-in-part of U.S. Ser. No. 08/401,099 filed Mar. 6, 1995, naming N. Pasch et al. as inventors, and entitled "SYSTEM AND METHOD FOR PERFORMING OPTICAL PROXIMITY CORRECTION ON MACROCELL LIBRARIES." That application is incorporated herein by reference in its entirety for all purposes.

BACKGROUND OF THE INVENTION

1. Field of the Invention

The invention relates to the area of electronic design automation (EDA), and more particularly to optical proximity correction of sub-micron mask designs.

2. Description of Background Art

A fabrication mask or reticle is used when fabricating a semiconductor device. Such a mask has a light-transparent portion (e.g., glass) and a light-shielding portion (e.g., chromium) that define a circuit pattern to be exposed on a wafer. Such patterns may define diffusion regions or field oxidation regions provided on a substrate. They may also define gate electrode patterns at a polysilicon level or a metal line patterns at any metallization layer of a chip. The mask and reticle must have a precisely defined circuit pattern. Photolithography is a process used for patterning semiconductor wafers during the manufacture of integrated circuits, such as application specific integrated circuits (ASICs).

The reticle is placed between a radiation source producing radiation of a pre-selected wavelength and a focusing lens which may form part of a "stepper" apparatus. Placed beneath the stepper is a resist covered silicon wafer. When the radiation from the radiation source is directed onto the reticle, that fraction of the radiation passing through the glass projects onto the resist covered silicon wafer. In this manner, an image of the reticle is transferred to the resist. For further information on IC fabrication and resist development methods, reference may be made to a book entitled *Integrated Circuit Fabrication Technology* by David J. Elliott, McGraw Hill, 1989.

Light passing by the edge of a reticle pattern feature (e.g., the boundary between a chromium coated region and a transparent region) will be diffracted, so that rather than producing a very sharp image of the feature edge, some radiation diffracts beyond the intended image boundary and into the dark regions. Hence feature shapes and sizes deviate somewhat from the intended design. For ultraviolet radiation in common use today, the intensity of the diffracted radiation drops off quickly over a fraction of a micron, so the affect does not prove particularly problematic when devices have dimensions on the order of 1 micrometer. However, as device dimensions have shrunk to the submicron domain, diffraction effects can no longer be ignored.

The diffraction errors can be compensated for by increasing the thickness of various critical features on the pattern. For example, increasing the width of a line on the pattern will reduce the diffraction effects. Unfortunately, this defeats the purposes of using small critical dimension features; greater logic density and improved speed.

FIG. 1A shows a hypothetical reticle 100 corresponding to an IC layout pattern. For simplicity, the IC pattern consists of three rectangular design features. A clear reticle glass 110 allows radiation to project onto a resist covered silicon wafer. Three rectangular chromium regions 102, 104 and 106 on reticle glass 110 block radiation to generate an image corresponding to intended IC design features.

FIG. 1B illustrates how diffraction and scattering affect an illumination pattern produced by radiation passing through reticle 100 and onto a section of silicon substrate 120. As shown, the illumination pattern contains an illuminated region 128 and three dark regions 122, 124, and 126 corresponding to chromium regions 102, 104, and 106 on reticle 100. The illuminated pattern exhibits considerable distortion, with dark regions 122, 124, and 126 having their corners rounded and their feature Widths reduced. Other distortions commonly encountered in photolithography (and not illustrated here) include fusion of dense features and shifting of line segment positions. Unfortunately, any distorted illumination pattern propagates to a developed resist pattern and ultimately to IC features such as polysilicon gate regions, vias in dielectrics, etc. As a result, the IC yield is degraded or the reticle design becomes unusable.

To remedy this problem, a reticle correction technique known as optical proximity correction ("OPC") has been developed. Optical proximity correction involves adding dark regions to and/or subtracting dark regions from a reticle design at locations chosen to overcome the distorting effects of diffraction and scattering. Typically, OPC is performed on a digital representation of a desired IC pattern. First, the digital pattern is evaluated with software to identify regions where optical distortion will result. Then the optical proximity correction is applied to compensate for the distortion. The resulting pattern is ultimately transferred to the reticle glass. OPC is described generally at the end of this document.

FIG. 1C illustrates how optical proximity correction may be employed to modify the reticle design shown in FIG. 1A and thereby better provide the desired illumination pattern. As shown, a corrected reticle 140 includes three base rectangular features—142, 144, and 146—outlined in chromium on a glass plate 150. Various "corrections" have been added to these base features. Some correction takes the form of "serifs" 148a–148f and 149a–149f. Serifs are small appendage-type addition or subtraction regions typically made at corner regions on reticle designs. In the example shown in FIG. 1C, the serifs are square chromium extensions protruding beyond the corners of base rectangles 142, 144, and 146. These features have the intended effect of "sharpening" the corners of the illumination pattern on the wafer surface. In addition to serifs, the reticle 140 includes segments 151a–151d to compensate for feature thinning known to result from optical distortion.

FIG. 1D shows a hypothetical "corrected" illumination pattern 160 produced on a wafer surface 160 by radiation passing through the reticle 140. As shown, the illuminated region includes a light region 168 surrounding a set of dark regions 162, 164 and 166 which rather faithfully represent the intended pattern shown in FIG. 1A. Note that the illumination pattern shown in FIG. 1B of an uncorrected reticle has been greatly improved by use of an optical proximity corrected reticle.

OPC, as now practiced, involves modifying a digital representation of a reticle design such as that shown in FIG. 1A. The modification is performed by a computer such as workstation having appropriate software for performing OPC. Points separated by less than the critical dimension on the design are evaluated in sequence and corrected as necessary. Evaluation of each point requires analysis of surrounding features in two-dimensions to determine whether problematic diffraction effects are likely. If so, an appropriate correction (serif or segment removal, for example) is performed.

A problem with using OPC when performing a full mask design correction is that a substantial commitment must be made in terms of time and computing power in order to optically correct the integrated circuit design, such as an ASIC design. For example, a moderately complex integrated circuit design may require at least a few days to correct with OPC even when the OPC algorithm runs on the fastest modern workstations. Often an ASIC will be attractive to a customer only if it can be designed in a relatively short period of time. If the time committment is too great, then other integrated circuits such as programmable logic devices may look more appealing. Further, an ASIC designer may need to perform a full-mask design OPC on tens of thousands of ASIC designs annually. Accordingly, a significant time and computing commitment must be invested in order to perform OPC on all of a designer's ASIC designs.

The computational expense of OPC can be understood by recognizing as pointed out that the correction often involves adding multiple small serifs to corners of design features and removing from, adding to, or displacing lateral sections of lines. First, these many small modifications greatly increase a pattern's complexity. Second, the modifications are made by evaluating an initial pattern with very fine granularity—typically evaluating potential correction points separated by no more than about 0.02 micrometers (using a 0.25 micron critical dimension technology). Note that a typical reticle design may include about 50–100 million "rectangles" of average size 0.5 by 0.5 micrometers. Finally, each correction is made by evaluating the surrounding pattern features in two dimensions. For example, a decision as to whether a point under consideration should be corrected may be made only after a five by five grid of surrounding points is first evaluated.

What is needed is a system and method for efficiently and accurately performing OPC on integrated circuit designs.

SUMMARY OF THE INVENTION

The invention provides a system and method for performing optical proximity correction on an integrated circuit mask design by initially performing optical proximity correction on a library of cells that are used to create the integrated circuit. The pre-corrected cells are imported onto a mask design. All cells may be placed a minimum distance apart (e.g., about 3 to 5 times the wavelength of the photolithography light) to ensure that minimal degradation from proximity effects will occur between elements fully integrated in different cells. Alternatively, the cells may be packed more closely so long as the perimeter or interfacial regions of the cells are subjected to OPC: preferably one-dimensional OPC. Because this OPC step is limited to the perimeter or interfacial regions and is performed in one-dimension, the total computational investment in correction for any given design is minimal.

One aspect of the invention involves a method of designing an integrated circuit that may be characterized as including the following: (a) selecting optical proximity corrected cells from one or more libraries of such cells; (b) placing one or more instances of cells selected from the one or more libraries adjacent to one another in an integrated circuit design; and (c) performing optical proximity correction on an integrated circuit mask layout at an interface between the instances of the cells on the integrated circuit design. The "instances" of the cells refer to individual copies of the cells as they exist as residents of an integrated circuit—as opposed to as generic versions generally available in a library.

The instances of the selected cells should be closely placed on the design, preferably no further from one another than about 3 to 5 times the wavelength of radiation to be used in performing photolithography during fabrication of the integrated circuit. After they are so placed, routing lines should be provided between them. It is these routing lines, outside the domain of cell, where optical proximity correction is typically performed.

While one-dimensional optical proximity correction on the interfaces between the cell instances is preferred, the invention may also be practiced with two-dimensional OPC.

Another aspect of the invention involves computer based systems that may be characterized as including the following items: (a) a storage device; (b) a cell library, located in the storage device, and comprising a plurality of cells, each containing a predefined integrated circuit functional component; (c) a place and route tool for placing instances of specified cells, selected from the library, on an integrated circuit mask layout; and (d) an optical proximity correction module for performing optical proximity correction on interfacial regions of the specified cells as provided on the integrated circuit mask layout.

Preferably, the place and route tool is configured such that cells in the mask design are separated by a distance of no greater than about 3 to 5 times the wavelength of radiation to be shown through a reticle containing the integrated circuit mask layout during photolithography. Preferably, the optical proximity correction module is configured to perform one-dimensional optical proximity correction on the interfacial regions containing features not appearing in the specified cells.

This invention also relates to reticles containing corrected layouts as produced by the systems and methods of this invention. Such reticles are intended for use in photolithography during which the corrected design layout on the reticle is used to produce an image on a wafer under fabrication. The invention further relates to integrated circuits fabricated with corrected designs produced by the systems and methods of this invention.

The invention may be further understood with reference to the following detailed description and associated drawings.

DETAILED DESCRIPTION OF THE PREFERRED EMBODIMENTS

Figure 1A:
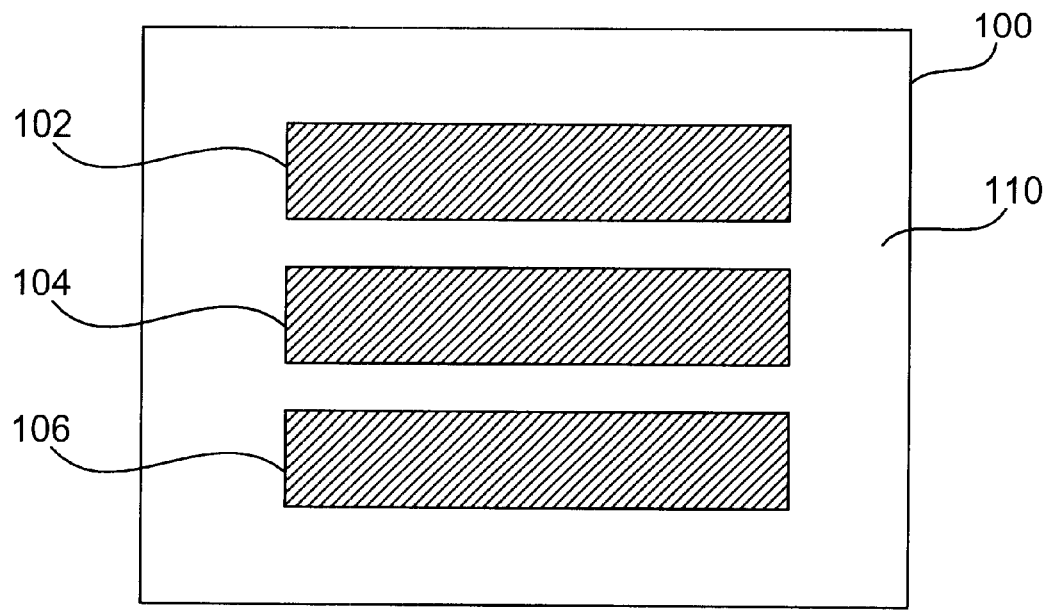
FIG. 1A illustrates a conventional reticle having an IC design pattern outlined in, for example, chromium on a glass backing.
Figure 1B:
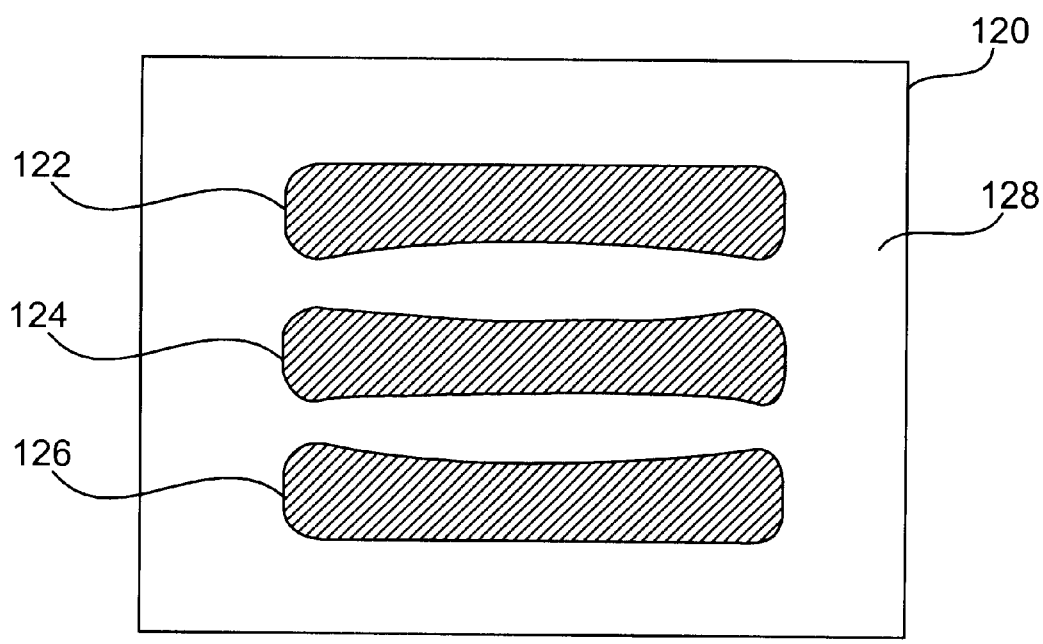
FIG. 1B shows an illumination pattern produced on a substrate by light shown through the reticle of FIG. 1A. The illumination pattern exhibits rounding and thinning effects that result when no optical proximity correction is performed.
Figure 1C:
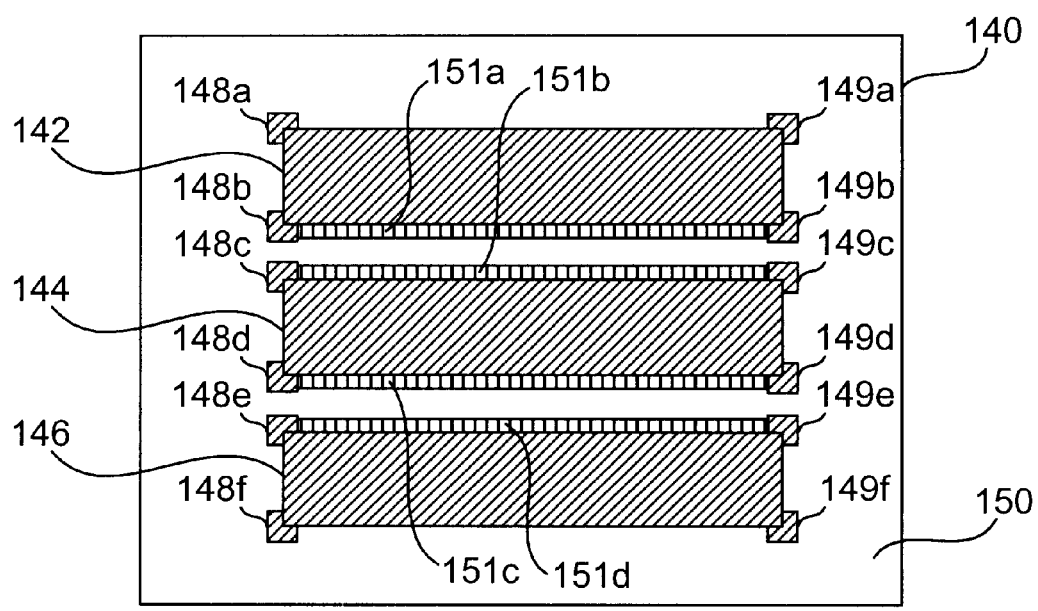
FIG. 1C illustrates a conventional reticle design employing optical proximity correction to overcome the rounding and thinning effects in the illumination pattern of FIG. 1B.
Figure 1D:
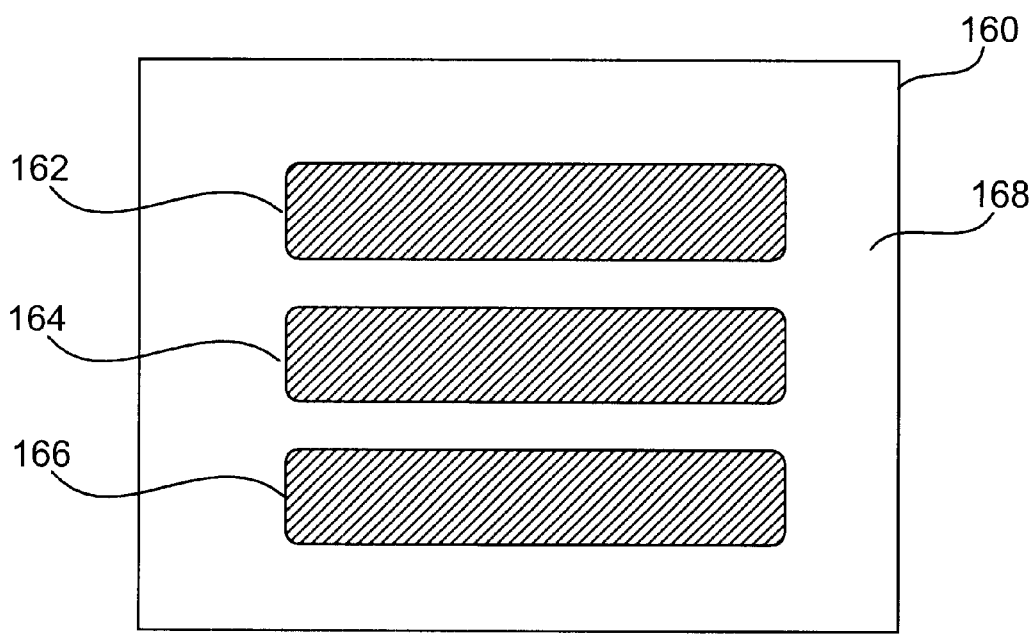
FIG. 1D shows an improved illumination pattern produced on a substrate by light shown through the optical proximity corrected reticle of FIG. 1C.

A preferred embodiment of the present invention is now described with reference to the figures where like reference numbers indicate identical or functionally similar elements. The invention will be described first, followed by a general discussion of OPC technology.

The Invention

The invention is directed to a system and method for performing optical proximity correction (OPC) on an integrated circuit (IC) mask design by initially performing optical proximity correction on a library of cells that are used to create the IC. The pre-tested cells are placed on a mask design. All cells are placed a defined distance apart and subjected to perimeter OPC to ensure that minimal proximity effects will occur between components fully integrated in different cells.

An integrated circuit can include thousands of cells where each cell includes many lines whose diffraction effects must be accounted for. During the integrated circuit design process, a design team typically employs "building blocks" (e.g., cells, macrocells, and/or cores) from a library of predesigned versions of such entities. A designer could create a mask design by directly designing all of the logic that is necessary for a particular IC. However, this would be an inefficient method of circuit design, especially when applied to ASIC design. The use of a cell library is generally far more efficient.

While the distinctions between cells/macrocells and between macrocells/cores is somewhat arbitrary, cells generally constitute relatively simple elements such as flipflops or SRAM circuits, while macrocells constitute more complex elements such as large adders, and cores constitute large functional blocks such as DSPs and RISC CPUs. A moderately sized integrated circuit may include 1 to 10 cores and very many more macrocells and cells.

During design, members of a design team using automated design tools select cells, macrocells, and/or cores from libraries. The particular entities chosen from the library provide the function required by design. For example, one small portion of a design may call for a clock buffer. The designers or design tools may then select one or more appropriate flip flop cells from a cell library. The flip flop circuits specified by the library cell or cells provide the functionality required to implement the clock buffer.

After selecting appropriate library elements, the designers position and connect the selected library entities with respect to one another on the chip under design. They do this with the aid of place and route design tools.

In ASIC design, a critical parameter is the time required to design a new chip. Because the cells, macrocells, and cores in libraries of this invention contain complete layout patterns that have been predesigned and optimized, the designer need not redesign the logic contained in these entities when engaged in a design project. This significantly reduces the time associated with design and increases the appeal of ASICs (vis-a-vis programmable logic devices for example) to end users.

Libraries may store individual cells in a "thin wire representation" or a "thick wire representation." The thin wire representation contains the circuit elements (e.g., MOS transistors) and connecting lines that make up the circuit. These lines, however, have no width. While the real wires ultimately incorporated in the design must have a finite width, the "widthless" wires of these library elements reduce the amount of information that must be stored in the library. They also help avoid choking that would quickly result from making intercell connections with finite width lines early in the design process. Intercell routing with thin wire cells can focus on making the necessary connections without crossing too many wires. Crossed wires are sometimes referred to as "unresolved nets."

As noted, libraries may also be provided with thick wire cell representations. These may be employed in the place of thin wire representations, with attendant line crossing and choking complexities. Alternatively, the thick wire representations may be employed after the thin wire representations have first been put in place and connected.

As noted, cells, macrocells, or cores in a library of this invention are corrected by OPC. These corrected cells may include thin or thick wire representations. They are employed to construct an integrated circuit design. Such designs need no further correction or only minimal correction at the cell perimeters. Because OPC need not be performed on each complete reticle pattern, designers can complete an optically proximity corrected IC design in a relatively short period of time.

Cells in a thick wire representation may be annotated with OPC information by simply preadjusting the shapes, sizes, and locations of the wires of the representation to the configurations they would have after OPC is performed. No further annotation is required. In the case of thin wire representations, there are no wire shapes or thickness to adjust. Thus, the OPC information is provided to the thin wire cells as a list of points or positions and associated line widths. More generally, the thin wire representation may be annotated with rules specifying how to create full thick wires having the necessary optical proximity correction.

Figure 2:
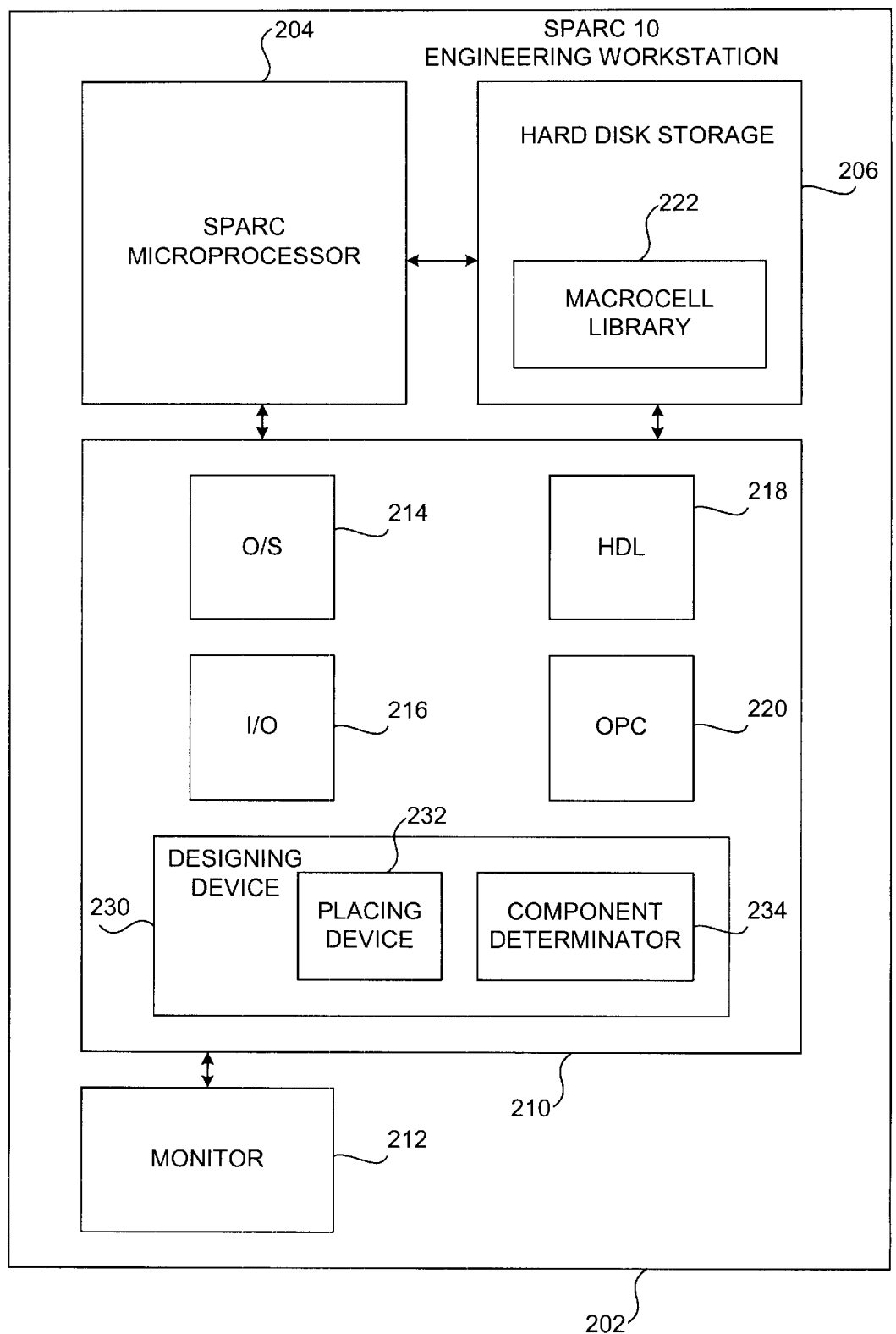
FIG. 2 is an illustration of an environment in which the present invention may operate.

FIG. 2 illustrates an environment in which the present invention may operate. The preferred embodiment operates on an engineering workstation 202, such as a SPARC Station 10 that is commercially available from Sun Microsystems, Inc., Mountain View, Calif. Workstation 202 includes a microprocessor 204 that is coupled to a non-volatile storage device, e.g. a conventional hard disk storage device 206. The microprocessor 204 and the hard disk storage device 206 are coupled to a volatile storage device, e.g. a random access memory (RAM) 210. A user interface, e.g., a monitor 212, is coupled to the workstation 202. The RAM 210 stores, during operation, an operating system (O/S) 214, e.g., UNIX, a conventional input/output (I/O) module 216, a hardware description language (HDL) module 218, and an optical proximity correction (OPC) module 220. In addition, the RAM 210 may temporarily store, during operation, a designing device 230 that includes a placing and routing device or tool 232 and a component determinator 234. The functions of device 232 and determinator 234 are presented below.

A hardware design language associated with HDL module 218 can be, for example, Verilog, commercially available from Cadence Design Systems Inc., San Jose, Calif., or very high speed integrated circuit hardware description language (VHDL). The OPC module 220 includes physical data instructions, that when implemented by the microprocessor 204 causes the microprocessor to perform an OPC on one or more target cells or on interfaces between cells, as described below.

As discussed above, OPC is a technique that corrects a mask design against potential light diffraction effects. In conventional systems, a mask design is fully created and is then corrected using an OPC technique. Some examples of OPC techniques are described in Otto, et al., *Automate Optical Proximity Correction-A Rules-based Approach,* SPIE Optical/Laser Microlithography VII, March 1994, and Helmsen et al. *3D Lithography Cases for Exploring Technology Solutions and Benchmarking Simulators,* SPIE: Optical/Laser Microlithography VI, pp. 382–394, March 1994, that are incorporated herein in their entirety. OPC as described in the Otto reference is presented generally at the end of this document.

The hard disk storage 206 includes a cell library 222. The cell library is a physical database representing a collection of cells, at least some of which have been optical proximity corrected. In alternative embodiments, the physical database can represent any combination of design elements, e.g., macro cells, cores, etc.

The component determinator 234 determines which cells from library 222 should be employed in a design as specified by a designer employing a design tool such as HDL module 218. Basically, the determinator recognizes the electrical function specified by a high level design, such as an HDL design, and selects cells that meet the functional requirements. Placing and routing device 232 places cells selected by determinator 234 from library 222 onto the layout for the integrated circuit. It then routes wires between adjacent cells to make the electrical connections necessary to implement the functions specified in the high level design.

The advantage of using precorrected cell libraries can be understood in the context of a common hierarchical IC design. Such designs have a root level, various intermediate levels, and leaf levels. The root may be the entire IC design or at least high level functional blocks within the design. The leaf levels may include specific circuits such as AND gates and memory elements. Cells specifying the low level leaf elements of the IC are provided in a library. Higher level features such as macrocells and cores may also be provided in libraries.

Many instances of a given cell or macrocell may be employed in a hierarchical IC design. And over many different designs, a given cell may be employed many thousands of times. Optical proximity correction need be performed only once on all or at least many cells in a library. Thereafter, the correction is provided with each instance of a cell employed by a designer in any given design. Each instanciation of any given cell is already corrected. In essence, the use of OPC cells in an IC design leverages the correction performed at an earlier time on the individual cells, macrocells, etc. This should be contrasted with the conventional OPC procedure in which each new IC design is first constructed of uncorrected cells and later subjected to a full chip OPC correction. Obviously, with the present invention, the OPC procedure on the entire integrated circuit design need not be performed. This represents a substantial time and computational resources saving over the conventional approach.

Figure 3:
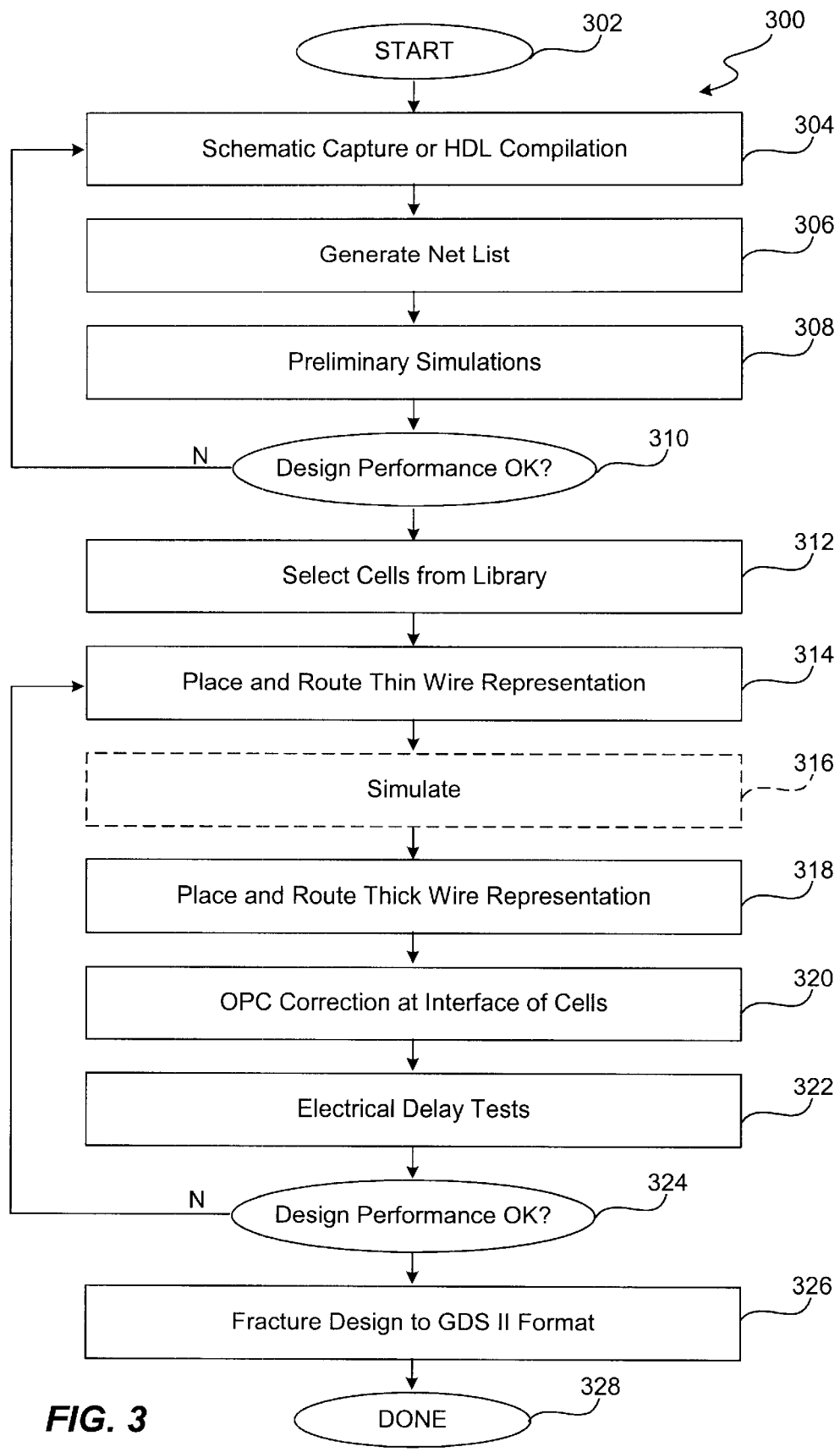
FIG. 3 is a process flow diagram of an automated electronic design process in accordance with a preferred embodiment of the present invention.

FIG. 3 presents a process flow 300 for performing electronic design automation in accordance with one embodiment of the present invention. The process begins at 302 and in a step 304 the system (through its CPU and some software such as HDL module 218) captures a high level schematic representation of the integrated circuit or compiles an HDL description of the integrated circuit. Which of these is employed depends upon the design tools employed and the designer's approach. The designer may present the high level description of the circuit in the form of HDL statements which the system compiles. Alternatively, the designer may provides the integrated circuit description in the form of a schematic, which the system will "capture."

As a result of the action or actions taken in step 304, the system generates a net list of the integrated circuit design at a step 306. As is known to those of skill in the art, the net list provides the nodes and links (e.g., gates) between nodes that define a electrical schematic implementing the functions of the HDL statements. After step 306, the design embodied in the net list is subjected to a preliminary simulation to determine if its performance is suitable at a step 308.

Next, at a step 310, the designer and/or electronic design tool determines whether the simulation has met the specified criteria. Assuming that the simulation indicates that the current design's performance is inadequate (i.e., decision step 310 is answered in the negative), process control returns to step 304 where a revised schematic or HDL description is processed as described above.

Alternatively, if the preliminary simulations indicate that performance meets or exceeds the defined criteria (i.e., decision step 310 is answered in the affirmative), the system selects appropriate cells, macrocells, or cores from one or more appropriate libraries to implement the functions specified in steps 304 and 306. This is illustrated in FIG. 3 at a step 312. The chosen design entities will have been precorrected as they exist in a library. They are then imported onto a mask design.

In the embodiment shown, these cells or other entities are provided as thin wire representations. After the appropriate cells have been selected at step 312, the system places and routes these thin wire cells at a step 314. In accordance with this invention, the thin wire representations employed in step 314 are preferably optical proximity corrected. The separation distance between the individual cells placed during this stage of the design process is chosen to minimize the area occupied by the design, while providing a safety margin to avoid the possible affects of diffraction in the non-optically corrected perimeter region of the cells. Methods and criteria employed to determine the separation distances are described below.

Next, an optional step 316 simulates the critical paths of the design to ensure that the design is performing as expecting. Depending on the electronic design tool employed in the design, step 316 may or may not be performed. Examples of design tools allowing such simulation are available from Cadence Corporation of San Jose, Calif. and CMDE3 available from LSI Logic Corporation of Milpitas, Calif.

After step 314 is performed (or after step 316 is performed if that step is actually performed), the placed and routed thin wire representations are converted to thick wire representations at a step 318. In this step, the system notes the optical proximity corrected wire specifications from the thin wire cell representations placed in step 314. The system then converts the thin wires to optical proximity corrected thick wires at step 318.

After the thick wires have been placed and routed as indicated at step 318, the system performs optical proximity correction on the perimeter regions of the various cells making up the IC design. This is done at a step 320. As will be explained in more detail below, this step is preferably conducted via a one-dimensional OPC process. However, in an alternative embodiment, a two-dimensional OPC process may be employed to perform the correction.

After the perimeter regions of the cells have been corrected at step 320, the system performs one or more electrical delay tests at a step 322. These may include various conventional net list verification critical delay timing tests.

This system then determines, at a decision step 324, whether the test results suggests that the current design is acceptable. If this test finds unacceptable performance, process control returns to step 314 where further routing of the thin wire cell representations may be made. If no further modifications are required at step 314, further modifications of the thick wire representations can be made at step 318.

Assuming that the system finds that the design's performance is adequate, at decision step 324, the design is fractured, at a step 326, to convert it to a format meeting the GDS II standard. Thereafter, the process is completed at 328. The fracturing process involves dividing the lines comprising the integrated circuit layouts into rectangles meeting the rules for GDS II.

As noted, step 314 involves placement and routing of thin wire representations of the various cells that comprise the integrated circuit design. In the routing stage of this process, the place and route tool 232 will attempt to route the individual thin lines between adjacent cells in a manner that provides the necessary electrical functionality and minimizes the number of "unresolved nets" (i.e., crossed wires). In a typical modern integrated circuit design, there may be as many as about two hundred unresolved nets after the design tool has finished its contribution to the place and route function. At this point, a designer must manually pick through the unresolved nets and hand patch the lines to uncross all previously crossed wires.

After the designer and design tools are satisfied with the thin wire design of the circuit, the system adjusts the thin wires to nominal thicknesses (step 318) determined by the available space, the current carrying requirements of the lines, the timing requirements of the system, and optical proximity correction. This "thickening" of the wires may lead to further design difficulties such as interfering lines and additional crossed lines. Typically, the place and route tool will resolve many of these problems. However, again there may remain as many as about two hundred unresolved nets. The designer must then pick through these nets to close them by hand patching.

By the time the designer is satisfied that placement and routing is appropriate, and design verification determines that performance is adequate, the system will fracture the internal representations of the wires to put the design in the GDS II format. A typical modern integrated circuit will contain about 10–50 million rectangles in the GDS II format. As is known to those of skill in the art, integrated circuit designs in the GDS II format include multiple rectangles, each defined by an anchor point (e.g., the top left corner) and a length and a width of a rectangle.

As explained above in connection with the discussion of step 314 of FIG. 3, the designer in conjunction with the appropriate place and route design tool 232 places corrected cells next to one another and separated by a specified distance. That distance can be calculated in various ways. As mentioned, it is desirable that the total design take up as little chip area as possible. Therefore, the cells should be placed rather close together. On the other hand, if the cells are placed too close together, the diffraction affects in the uncorrected perimeter regions of the cells may impair the line shape.

In a first preferred embodiment, the individual cells are separated from one another by a distance of about 3 to 5 times the wavelength ($\lambda$) of the photolithography light. Thus, for a conventional photolithography system employing ultraviolet light of about 300 nanometers wavelength, the individual cells should be separated from one another by a distance of about 900–1500 nanometers or about 1 to 1.5 micrometers. This separation distance ensures that the diffraction effects at the perimeter regions of the adjacent cells do not impair the line shapes in these regions to the point where a performance degradation occurs.

In this embodiment, it may be unnecessary to perform OPC on the perimeter regions. Thus, step 320 in the above process flow may be dispensed with. Alternatively, some level of optical proximity correction technique may be performed on the mask design by performing proximity correction only on those components, e.g., lines, that are not fully integrated within a cell. These lines may be those introduced during the routing portion of "place and routing."

In a second preferred embodiment, the individual cells consituting the integrated circuit are placed (at step 314 of FIG. 3) as close to one another as possible. In some cases, the individual cells of the layout may directly abut one another. In order to mitigate the detrimental effects of diffraction in the perimeter regions, OPC is performed on the design, but limited to the perimeter regions of the cells. For example, the optical proximity correction technique is performed on the mask design only on those components, e.g., lines, that are not fully integrated within a cell. Again, these lines may be introduced during the routing portion of "place and routing." Because this OPC step is limited to the perimeter region of the cells, it takes far less time than performing OPC over the entire chip—as was the case in the prior art.

The OPC performed in the perimeter regions, in accordance with this embodiment, may be performed in one dimension or two dimensions. One-dimensional correction is much faster than two-dimensional correction, but may not obtain the same level or correction.

Figure 4A:
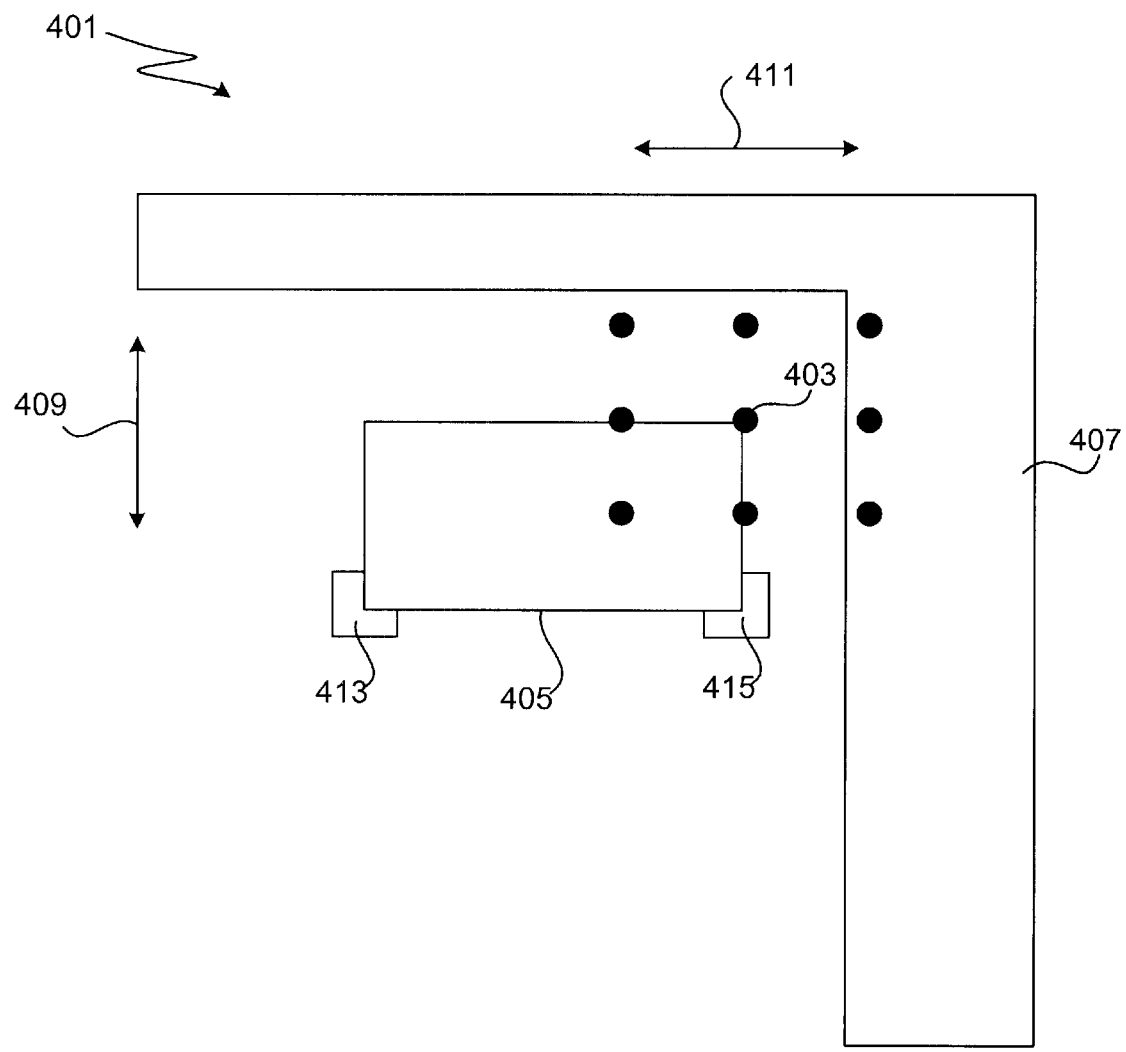
FIG. 4A is a diagram of a section of a cell being corrected by two-dimensional OPC.
Figure 4B:
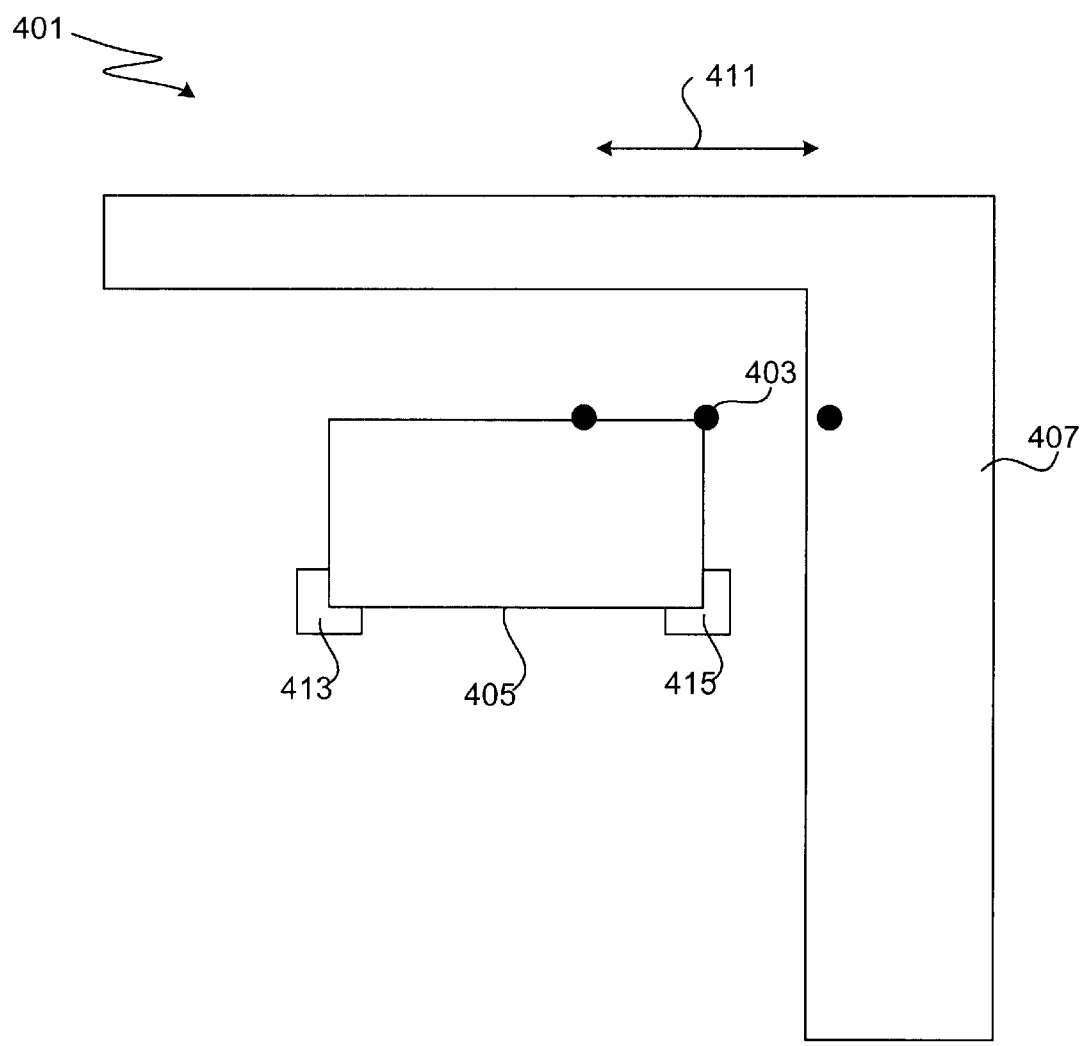
FIGS. 4B and 4C are diagrams of the cell section shown in FIG. 4A, but being corrected by one-dimensional OPC (in two stages).

One and two dimensional correction processes are illustrated in FIGS. 4A and 4B. As shown in FIG. 4A, a current correction point 403 is being evaluated in a section 401 of a cell. Point 403 is located at a corner region of a a rectangular feature 405 and adjacent to an L-shaped feature 407. It should be understood that during an OPC process, numerous points on the edges of features 405 and 407 are separately evaluated, in turn, for potential optical proximity correction. For simplicity, only point 403 is illustrated here.

As shown, when point 403 is under consideration, the system evaluates features in both the vertical and horizontal directions as illustrated by arrows 409 and 411. Before a correction decision is made, the system evaluates points adjacent to point 403 in both the vertical and horizontal directions as shown. Specifically, eight points are shown surrounding current point 403. Each of these eight points must be considered before the correction decision is made.

In more sophisticated algorithms, as many as one hundred points (including the point under consideration) are evaluated before a correction decision can be made for the current point. While the resulting correction is highly accurate, it requires a significant computational expenditure.

As illustrated in FIG. 4A, some corrections (serifs 413 and 415) have already been made in section 401. The amount of correction, if any, is decided on by determining which of the surrounding points are on dark features and which are on light features.

Figure 4C:
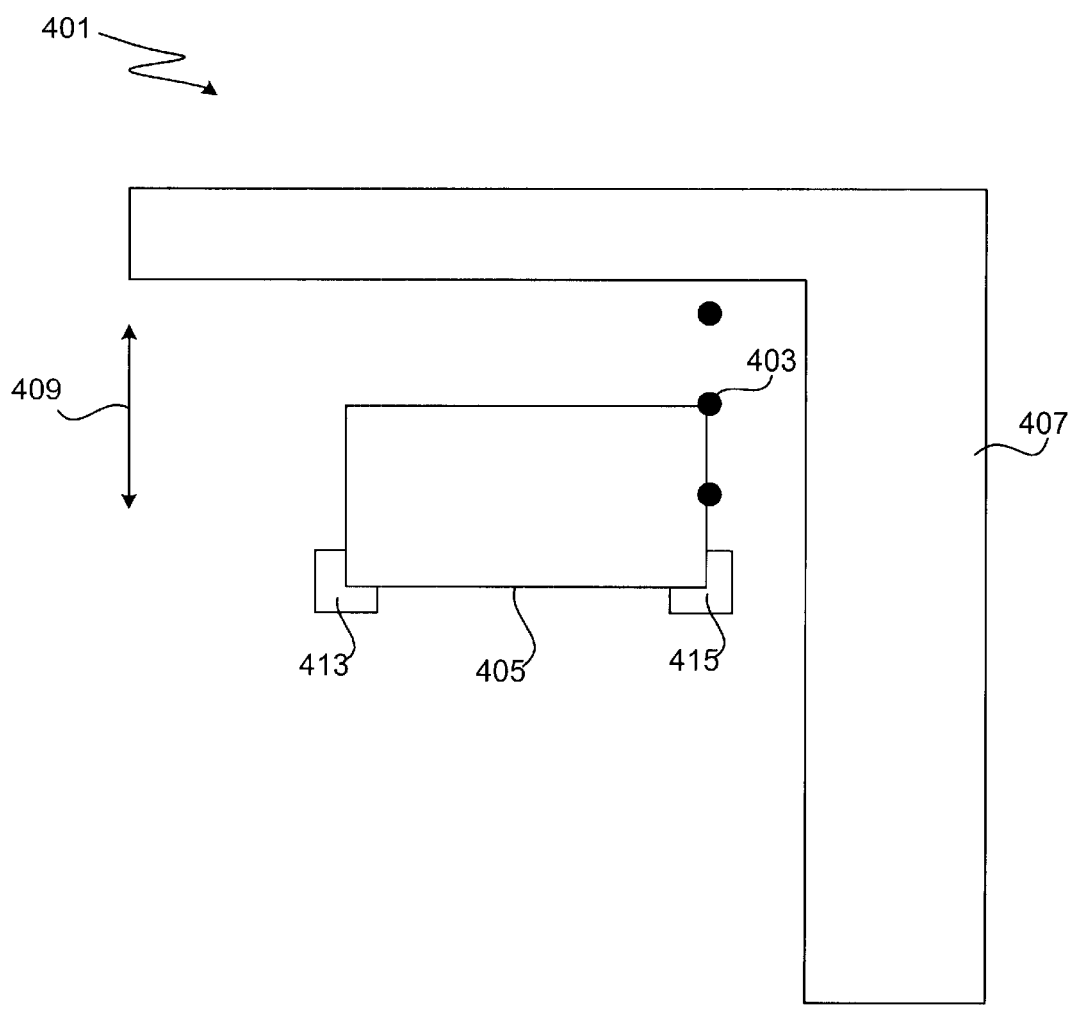

FIGS. 4B and 4C illustrate the one-dimensional OPC process. The process requires two figures because it actually takes place in two steps. While the two-dimensional correction takes place in one step, it requires significant additional computation in that single step. As shown in FIG. 4B, the section 401 of a cell is reproduced with the features illustrated in FIG. 4A. In addition, the OPC point under correction 403 is depicted at the same location.

In this case, however, correction is performed on the basis of an evaluation made in a single direction (the horizontal direction is indicated by arrow 411). In the embodiment depicted, only three points (current OPC point 403 and adjacent points to the left and to the right) are considered in making the first pass of the one-dimensional correction. Based upon the system's evaluation of point 403 together with its two adjacent horizontally separated points, the system determines a horizontal off-set for point 403. As illustrated in FIG. 4C, the second stage of the one-dimensional correction involves comparison of point 403 with two vertically separated adjacent points. Based on the information gathered during this correction step, a vertical off-set is determined with respect to point 403. The information obtained in the passes illustrated in FIGS. 4B and 4C is then combined to generate a serif or other correction to feature 405 at point 403.

While the two-dimensional correction illustrated in FIG. 4A took place in only a single step, it required consideration of nine points. In contrast, the two paths one-dimensional correction illustrated in FIGS. 4B and 4C required only five points. Thus, the one-dimensional correction is performed with less computational effort.

While the two-dimensional correction should, in theory, provide a more full correction, the distinction between one-dimensional and two dimensional correction is not significant in the perimeter regions. This is because the correction (one- or two-dimensional) is performed only along a straight edged interface between two adjacent cells. Thus, one-dimensional correction is generally preferred.

Nevertheless, because the corrections are not perfect, some small separation distance should be provided between adjacent cells. The amount of separation will depend upon the error inherent in a one-dimensional correction. This error can be approximated empirically.

Figure 5A:
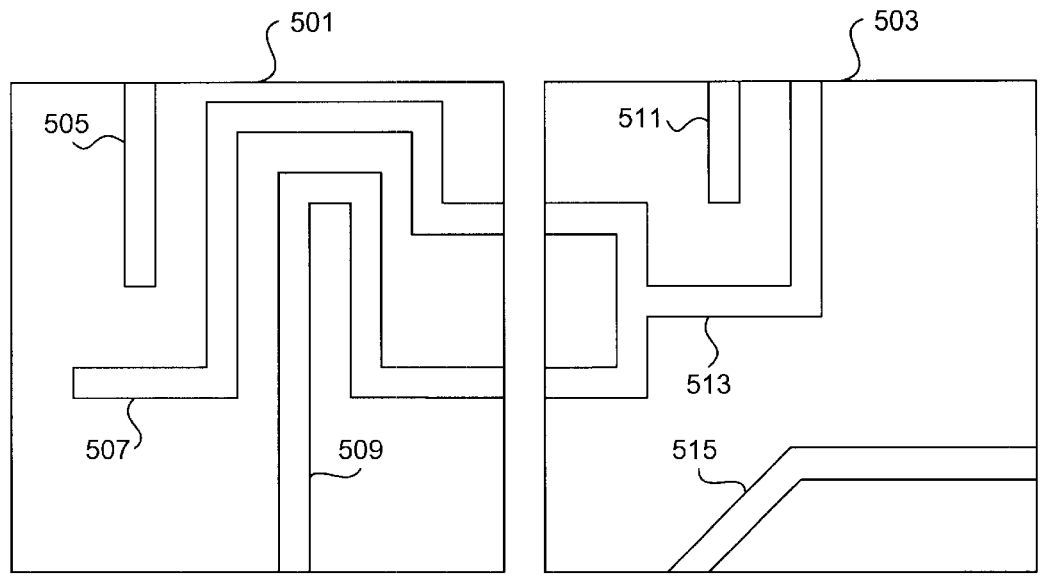
FIG. 5A is a diagram of two uncorrected cells from a library.

FIGS. 5A–5D illustrate the various stages of cell correction and assembly in accordance with this invention. Initially, as illustrated in FIG. 5A, a library includes a plurality of cells, each having a defined layout and associated features. For convenience, only two cells, 501 and 503 are illustrated in this figure. Also, for convenience, only three features are illustrated in each of these cells. Note, that features 505, 507 and 509 in cell 501 each have sharp abrupt angles. The same is true of features 511, 513, and 515 in cell 503.

Figure 5B:
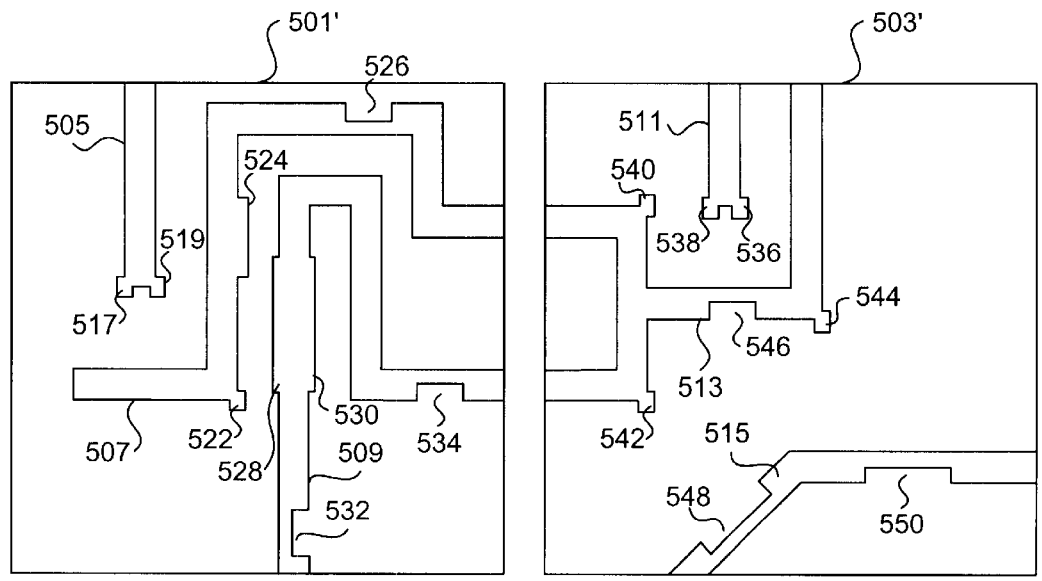
FIG. 5B is a diagram of optical proximity corrected versions of the cells shown in FIG. 5A.

Initially, each cell in the library is optical proximity corrected to produce modified cells 501' and 503' as illustrated in FIG. 5B. While the details of OPC are not relevant here, in a hypothetical example, feature 505 of cell 501 is corrected by adding serifs 517 and 519. In addition, feature 507 is corrected by adding serifs 522 and 524. Feature 507 is also corrected by removing a section of material 526. Feature 509 is corrected by adding serifs 528 and 530, and removing sections 532 and 534.

Cell 503 is similarly corrected to yield cell 503' as shown in FIG. 5B. As shown, serifs 538 and 536 are added to feature 511. Similarly, serifs 540, 542 and 544 are added to feature 513. In addition, a section 546 is removed from a horizontal segment of feature 513. Still further, segments 548 and 550 are removed from feature 515.

Figure 5C:
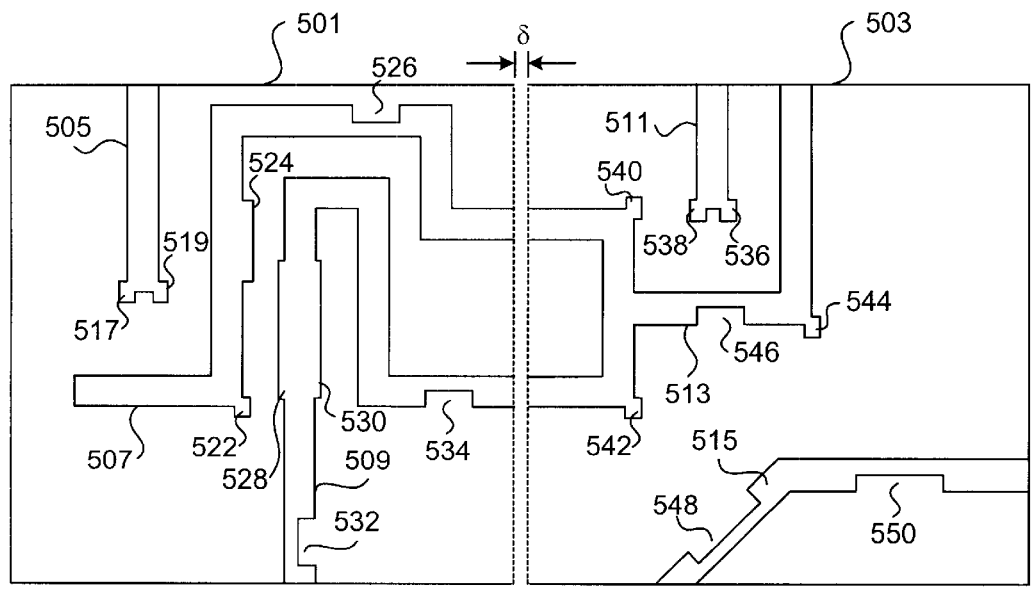
FIG. 5C is a diagram of the corrected cells from FIG. 5B after they have been placed next to one another in an integrated circuit design and maintained at a separation distance in which diffraction effects to adversely affect the perimeter regions of the cells.

As discussed above, many or all cells in the library 222 were optical proximity corrected. Nevertheless, when two or more such cells are placed in close proximity to each other, optical proximity effects may occur at the boundaries of these adjacent cells. For example, with reference to FIG. 5C, proximity effects may occur between elements 513 of cell 503' and element 509 of cell 501'. As noted, this may be handled in two ways: (1) the cell boundaries may be optical proximity corrected, or (2) the individual cells are separated by a minimum distance ($\delta$) as shown in FIG. 5C. The minimum distance, ($\delta$) must be wide enough to ensure that no optical proximity effects will occur. Often a $\delta$ of approximately $3(\lambda)$ or greater will ensure that optical proximity effects will not occur between elements of two adjacent cells.

FIG. 5C illustrates how cells 501' and 503' could be combined in accordance with the first embodiment of this invention. In this case, as illustrated, the cells are placed next to each other, but separated by a buffer region 554 of about 3 to 5 times the wavelength of the photolithography light. After cells 501' and 503' are placed in this orientation, features 507 and 509 are simply extended across region 554 to make connection with two prongs of feature 513 in cell 503'. No further correction is made.

Figure 5D:
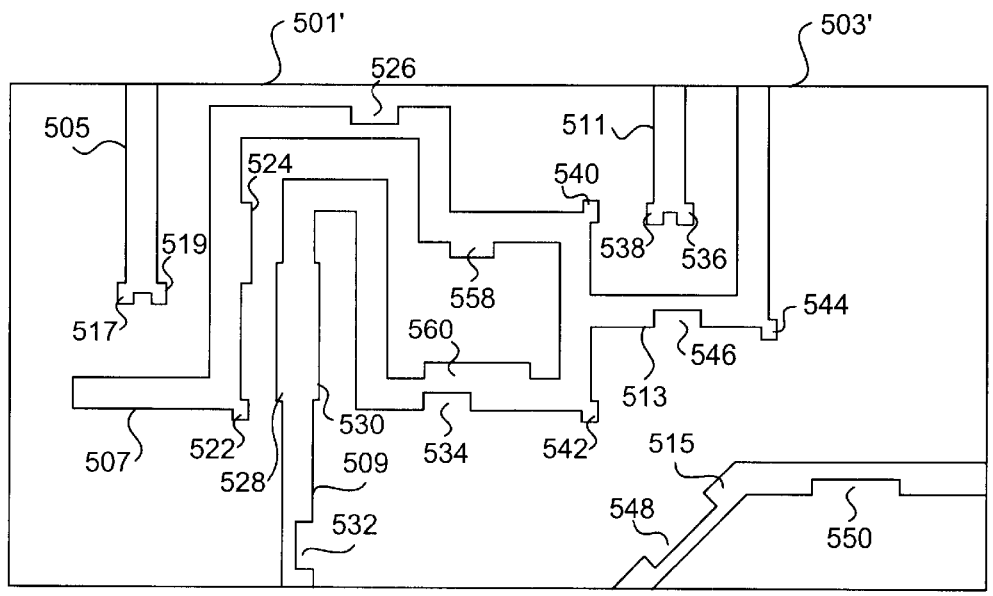
FIG. 5D is a diagram of the corrected cells from FIG. 5B after they have been placed next to one another in an integrated circuit design and corrected by OPC in their perimeter regions so that they can placed closer together than in the design of FIG. 5C.

FIG. 5D illustrates the second preferred embodiment of this invention in which cells 501' and 503' are placed much closer to one another. Note that buffer region 554 is not required in this embodiment. However, after cells 501' and 503' are brought into close proximity, the perimeter or interface region between them is subject to at least a one-dimensional optical proximity correction. As a result, a segment 558 is added to the connection between features 507 and 513. In addition, a segment 560 is added to the connection between feature 509 and feature 513. Depending upon the actual OPC algorithm employed and the arrangement of features in cells 501' and 503', the results of the correction may take many forms, and are in no way limited to the segment removals illustrated in FIG. 5D.

OPC Technology

The following is a general description of OPC as presented in the above-referenced article by Otto et al. The invention is not limited to OPC as described herein.

Rules-Based Approach

A proximity correction tool may be based on one or a combination of two paradigms: rules-based or model-based. A rules-based approach consists of applying a predetermined correction which applies to the local layout geometry. A model-based approach consists of computing the required corrections for the local layout from models for the imaging system and the development and etching processes. A model-based approach is effective only if the models accurately represent the imaging and pattern transfer processes. If the models are good, there is still the fundamental problem that model-based correction is extremely computation intensive and iteration may be required for the corrections to converge.

In principle, a rules-based approach is a fast, powerful paradigm. Complex imaging, substrate and process phenomena can be folded into comparatively few parameters. These parameters define how to pre-compensate the layout for the combined effects of those phenomena using the table look-ups and simple arithmetic. The application of such rules to modify a layout is much faster than direct modeling. The rules parameters can be derived from models, from empirical results or from a combination of both. Once the rules parameters have been derived for a given process, they apply for all features on all masks.

The ideal mathematical objective of a proximity correction scheme is to compensate for the effect of neighboring features on edge placements so that the final on-wafer pattern is the same as the original layout specification. Corner rounding will occur and is acceptable to some degree depending on the application. The minimum corner radius is governed by the mask making tool, the optical stepper and the fabrication process. For any edge in the layout, the edge placement correction can be expressed as $$\delta_i = \delta(E, F, G_i), \qquad (1)$$

where

E is the value for exposure,

F is the value for focus, $G_i$ is the final on-wafer geometry in the area around edge i.

By selecting an operating point for exposure, $E_0$, and defocus, $F_0$, Equation 1 becomes $$\delta_i = \delta(G_i), \qquad (2)$$

where $\delta_i = \delta(E_0, F_0, G_i)$.

Equation 2 is the "rule" for correcting the placement of edge i. The challenge in a rules-based approach is to parameterize $G_i$ so that the parameterization covers a large number of geometric situations. Suppose the symbol I represents a category of geometric situations which applies to a significant subset of all possible edge environments. The objective is to find a geometric parameterization $$G_i = G_i(P_1, P_2 \ldots P_n), \qquad (3)$$

where $G_i$ is a parameterization which applies to any edge fasting in category I, $P_j$ is the jth parameter describing the geometric situation, n is the number of parameters.

Thus for any edge falling in category I, the edge placement correction rule is:

$$\delta_i = \delta_i(P_{1i}, P_{2i} \ldots, P_{ni}), \qquad (4)$$

where $\delta_i$ is a rule which applies to any edge falling in category I, $P_{ji}$ is the value of the jth parameter for edge I.

$$\delta_{equal\ line/gap}(w), \text{ where w is line width} \qquad (5)$$

$$\delta_{isolated\ line}(w), \text{ where w is line width} \qquad (6)$$

Each of these rules represent a large number of geometric situations and can be expressed with a single parameter. The rules may be represented as tables with $\delta$ values defined for specific values of w which are parameter grid points. Values of $\delta$ for w parameter values which are not on the grid points are determined by interpolation between the grid points. A generalization which combines of Equations 5 and 6 is $$\delta_{periodic\ line/gap}(w, g), \text{ where w is line width, g is gap width} \qquad (7)$$

In addition to incorporating the two pervious rules, this rule covers a broader class of geometric situations. Again, the rule may be represented as a table with $\delta$ values defined on two-dimensional (w,g) grid points. Values of $\delta$ for (w,g) parameter values which are not on grid points are determined by two-dimensional interpolation between grid point parameters require multi-dimensional interpolation.

Aerial image simulations with high NA, I-line lithography with 0.35 µm CDs, show that even the rule in Equation 7 is inadequate for correcting many 1-dimensional situations. Investigations, however, indicate that a 5-parameter rule works quite satisfactorily:

$$\delta_{1D}(L_0, G_0, L_1, G_1, L_2) \qquad (8)$$

where $L_0$ is the width of the line for which this is the edge $G_0$ is the width of the gap for which this is the edge $L_1$ is the width of the line across the gap $G_0$ $G_1$ is the width of the gap on the other side of $L_0$ $L_2$ is the width of the line across the gap $G_1$.

It has been found that an important class of 2-dimensional effects are satisfactorily handled with the addition of two more parameters to the 1D rule: the length of the edge in question and the length of the edge across the gap. This may be referred to as a 1.5D rule since it is not really a general 2-dimensional rule and does not apply to corners in particular. It does however satisfactorily handle line-end shortening effects. The 1.5D rule is expressed as:

$$\delta_{1.5D}(L_0, G_0, L_1, G_1, L_2, W_0, W_1) \qquad (9)$$

where $W_0$ is the length of this edge $W_1$, is the length of the edge across the gap $G_0$ Some success has been had in improving corner radii for 90° (inside) and 270° (outside) corners by constructing corner insets and serifs, respectively, with 2D corner rules of the type:

$$\delta_{2D\ corner}(L_{x0}, L_{y0}, G_{x0}, G_{y0}, L_{x1}, L_{y1}) \qquad (10)$$

where $L_{x0}$ is the width of the corner figure perpendicular to this edge of the corner $L_{y0}$ is the width of the corner figure perpendicular to the other edge of the corner $G_{x0}$ is the width of the gap adjacent to this edge $G_{y0}$ is the width of the gap adjacent to the other edge $L_{x1}$ is the width of the line across the gap $G_{x0}$ $L_{y1}$ is the width of the line across the gap $G_{y0}$ Common non-orthogonal angled corners such as 135 (obtuse inside) and 225° (obtuse outside) do not yet have explicit rules generation support, however, preliminary simulations indicated that scaled versions (so as to reduce the serif size) of the right angle cases work fairly well. Intermediate angles (e.g. between 90° and 135°) can be handled by interpolation. This can be managed conveniently by merging the two tables (e.g. for 90° and 135°) and adding an angular range parameter ($0° < \alpha_{inside} < 180°$, $180° < \alpha_{outside} < 360°$):

$$\delta_{2D\ inside\ corner}(\alpha_{inside}, L_{x0}, L_{y0}, G_{x0}, G_{u0}, L_{x1}, L_{y1}) \quad (11)$$

$$\delta_{2D\ outside\ corner}(\alpha_{outside}, L_{x0}, L_{y0}, G_{x0}, G_{y0}, L_{x1}, L_{y1}) \quad (12)$$

Corners can appear in a variety of geometric situations, not all of which are well represented by the parameterizations in Equations 11 and 12. Investigations are in progress into a robust collection of corner classifications and rule parameterizations.

It has been shown that sub-resolution assist features (extra, or outrigger features) and/or sub-resolution assist slots (voids within a pre-existing feature) can extend the applicability of off axis illumination, mitigate side-lobe problems in attenuating or rim phase-shift masks, and may be utilized to reduce proximity effects. The parameterizations remains unchanged, but each table entry rather than being a single value representing the shift of the edge in question, is five values: the edge shift, the offset to the assist feature, the width of the assist feature, the offset to the assist slot, and the width of the assist slot.

For a process engineer, the objective of proximity correction is for all edge placements on the layout be within +10%(CD/2) of the layout specification over a common process (exposure/focus) window within which the processing facility can operate reliably. In writing Equation 2, a specific operating point was chosen for exposure and focus. But the process engineer requires a finite window of exposure and focus.

If the operating point for a given rules table entry were allowed to range over a finite exposure/focus window centered on the preferred operating point, a 2-dimensional map of correction values for a specific situation would be generated. That map would have a maximum and minimum value. Let us define the "median" correction value as the average of the maximum and the minimum correction values. Since, in general, the dependence of the correction value on exposure and focus is not linear, the median correction value is not the same as the value at the enter of the exposure/focus window.

Instead of containing correction values based on the preferred exposure and focus values, the table could contain the median of values over the exposure/focus window. Then the rules would not be optimum for any single exposure/focus combination, but would be optimized for maximum exposure/focus tolerance. One might choose the mean value instead of the median value if a better correction than provided by the median is desired over most of the focus range. A mean weighted by the probability of focus value could be used if the probability distribution of focus is known not to be uniform.

A table with sever parameters has a minimum of $2^7=128$ grid points, since each parameter must have at least two grid values for the table to show a dependence upon that parameter. If each parameter had 3 grid values, the table would have $3^7=2187$ entries. To obtain good correction, it is more likely that L0, G0 and L1 might require 10, 10 and 5 grid points so that a table might have $10\times10\times5\times3\times3\times3\times3=40,500$ entries. For a computer program, this is not an excessive amount of information. To generate that number of table entries with a tool based on an optical aerial image simulator is an intensive but not excessive activity, and once performed is applicable to any layout. To generate 40,500 table entries by physical measurement would require very high speed data acquisition-faster than 1 measurement per second, which does not appear feasible with today's measurement techniques. However, measurement of 128 points is quite feasible.

Simulation can be good at displaying trends and fine-grained behavior. If one accepts simulated results as representative of fine-grained behavior, then measured results on a much coarser grid could be used to "anchor" the rules tables generated by simulation. Anchoring requires at least two measure points to be specified. The simulated data is reshaped to match the measured points so that extracting a measured value for a measured data point is guaranteed. An analogous technique applies for multiple parameters. the more measured points there are, the better the anchoring, but anchoring to even as few as two measured points is better than no anchoring at all. This form of anchoring for multi-dimensional tables is available in a rules application tool.

Rules Generation by Simulation

The rule format evolution from 1D patterns through formats that may be viably applied to generic 2D geometric configurations will now be described. Once these formats were derived, an aerial-image based optimization system was applied to synthesize the OPC correction directives. While there appears good agreement between aerial-image predicated and resist measured behavior for most advanced resist systems, some resists deviate from that directed by the latent image. For such cases, some researchers are developing first order models that will be incorporated into the rule generation process. Also, as is discussed elsewhere in the appear, empirical measurements may also be used to fortify simulation based ruled. In any event, an appropriate rule format and associated optimization or measurement pattern "templates" are necessary. The evolution of such templates will not be described.

Partially coherent optical imaging is an inherently non-linear process. As such, many powerful linear signal processing approaches are rendered ineffective. For instance, the influence of one mask aperture on another may not be simply superposed. Rather, interacting apertures are related by the mutual coherence function.

$$\mu(\chi) = 2 J_1(\chi \sigma NA/\lambda)/(\chi \sigma NA/\lambda),$$

where $\chi$ is the aperture separation, $\sigma$ is the partial coherence of the stepper, $\lambda$ is the radiation wavelength and NA is the system numerical aperture.

The inter-feature proximity effects increase with light coherence and decrease as the wavelength is reduced. As optical lithography moves toward imaging features with critical dimensions (CD) in the k1=0.5 regime (CD=$k_1 \lambda$/NA), optical proximity effects become significant. For this case, the edge deviation results (from both edges) in a proximity induced CD change of 20%. Current process requirements demand a total CD variation of +10%. The optical proximity factor devours that entire lithography and etch process budget.

A rule format for the 1D case is rather straightforward. The edge correction should be a function of L0, G0 and, depending on $\sigma$ and the $k_1$ factor, G1, L1 and L2 may also need inclusion. As described previously, a 1D format is flexible in that one may include the influence of as many edges as desired.

The rule synthesis methodology employed may involve the optimization of pattern templates. While the details of this process will be further described below in the context of more advanced formats, in this 1D case, the template is optimized by adjusting the mask feature so that the ensuing printed image will more closely match the design. Correction rules are then based upon the particular predistortions derived by the template optimization process. A complete rule set results from a series of these optimizations that sufficiently samples the parameter space (L0, G0, . . . )

When considering optical effects, the selection of the sample parameter "grid" (the number of placements and placement values for each parameter) may be guided from some fundamental principles. Light diffracted through an aperture results in spill-over that exhibits the classic Bessel function behavior. The first minimum occurs near $0.6\lambda/NA$. The first "side-lobe" is approximately $0.5\lambda NA$ wide and the associated electric field is 180 degrees out of phase with the central light, a phenomenon exploited by some phase-shifting mask techniques. The first, and to some extent, the second side-lobe interact with neighboring features as determined by the mutual coherence function $\mu(\chi)$. In terms of estimating proximity effect ranges, the mutual coherence for $\sigma=0.5$ drops below 50% as the inter feature separation grows beyond $0.75\lambda/NA$. For the earlier example, this correspond to 1.1 $\mu$m. Note that the proximity effect diminishes to negligible levels for G0s beyond this value.

While the above considerations provide an indication of the range, the density of sample points within this range must also be addressed. Assuming the pattern conversion process linearly interpolates between "ruled" parameter states, a protocol should provide explicit rules at function "inflection" points.

Although the preferred embodiments of the present invention have been described in detail, it should be understood that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope of the appended claims.

What is claimed is:

1. A method of designing an integrated circuit, the method comprising:
   selecting optical proximity corrected cells from one or more libraries of such cells;
   placing one or more instances of cells selected from said one or more libraries adjacent to one another in an integrated circuit design; and
   performing optical proximity correction on an integrated circuit mask layout at an interface between said instances of said cells on the integrated circuit design without optical proximity correction of the entire integrated circuit mask layout.

2. The method of claim 1, wherein the one or more instances of said selected cells are placed no further from one another than about 5 times the wavelength of radiation to be used in performing photolithography during fabrication of the integrated circuit.

3. The method of claim 1, wherein the one or more instances of said selected cells are placed no further from one another than about 3 times the wavelength of radiation to be used in performing photolithography during fabrication of the integrated circuit.

4. The method of claim 1, further comprising routing lines between said instances of said cells.

5. The method of claim 4, wherein optical proximity correction is performed on the lines routed between the instances of said cells.

6. The method of claim 1, wherein one-dimensional optical proximity correction is performed on the interface between said instances of said cells on the integrated circuit design.

7. The method of claim 1, wherein two-dimensional optical proximity correction is performed on the interface between said instances of said cells on the integrated circuit design.

8. An integrated circuit formed from the integrated circuit design produced according to the method of claim 1.

9. A reticle containing said integrated circuit mask layout as corrected in the method of claim 1, said reticle being employed during photolithography to produce an image of said integrated circuit mask layout.

10. A computer based system comprising:
    a storage device;
    a cell library, located in said storage device, and comprising a plurality of cells, each containing a predefined integrated circuit functional component;
    a place and route tool for placing instances of specified cells, selected from said library, on an integrated circuit mask layout; and
    an optical proximity correction module for performing optical proximity correction on interfacial regions of said specified cells as provided on the integrated circuit mask layout without optical proximity correction of the entire integrated circuit mask layout.

11. The system of claim 10, wherein said place and route tool is configured such that cells in said mask layout are separated by a distance that is no greater than about 5 times the wavelength of radiation to be shown through a reticle containing said integrated circuit mask layout during photolithography.

12. The system of claim 10, wherein said optical proximity correction module is configured to perform one-dimensional optical proximity correction on said interfacial regions.

13. The system of claim 10, wherein optical proximity correction module corrects only those interfacial regions of the specified cells that contain features not appearing in the specified cells.

14. An integrated circuit formed from the integrated circuit design produced by the system of claim 10.

15. A reticle containing said integrated circuit mask layout as corrected by said optical proximity correction device of claim 10, said reticle being employed during photolithography to produce an image of said integrated circuit mask layout.

16. A computer based system comprising:
    means for storing data;
    means for providing cells from a library of cells;
    means for placing and routing instances of specified cells on an integrated circuit mask layout, the specified cells being selected from said library; and
    means for performing optical proximity correction on interfacial regions of said specified cells as provided on the integrated circuit mask layout without optical proximity correction of the entire integrated circuit mask layout.

17. The system of claim 16, wherein said means for performing optical proximity correction is configured to perform one-dimensional optical proximity correction on said interfacial regions.

18. The system of claim 16, wherein said means for placing and routing places cells in said mask layout such that they are separated by a distance that is no greater than about 5 times the wavelength of radiation to be shown through a reticle containing said integrated circuit mask layout during photolithography.

* * * * *